(12) United States Patent
Forester

(10) Patent No.: US 6,656,532 B2
(45) Date of Patent: Dec. 2, 2003

(54) LAYERED HARD MASK AND DIELECTRIC MATERIALS AND METHODS THEREFOR

(75) Inventor: Lynn Forester, Sunnyvale, CA (US)

(73) Assignee: Honeywell International Inc., Morristown, NJ (US)

(*) Notice: Subject to any disclaimer, the term of this patent is extended or adjusted under 35 U.S.C. 154(b) by 293 days.

(21) Appl. No.: 09/860,993

(22) Filed: May 17, 2001

(65) Prior Publication Data
US 2002/0172898 A1 Nov. 21, 2002

(51) Int. Cl.[7] .................................................. B05D 3/06
(52) U.S. Cl. ........................ 427/387; 428/446; 428/447; 428/448; 438/404; 438/781; 438/791; 438/634; 257/506
(58) Field of Search ................................. 428/446, 447, 428/448, 404, 781, 791, 634; 427/387; 257/506

(56) References Cited

U.S. PATENT DOCUMENTS

| | | | |
|---|---|---|---|
| 5,891,513 A | 4/1999 | Dubin et al. .................. 427/98 |
| 6,100,195 A | 8/2000 | Chan et al. .................. 438/687 |
| 6,218,317 B1 | 4/2001 | Allada et al. ................ 438/780 |
| 6,294,832 B1 | 9/2001 | Yeh et al. .................... 257/751 |
| 6,358,842 B1 * | 3/2002 | Zhou et al. | |

FOREIGN PATENT DOCUMENTS

EP    1 107 308    6/2001

OTHER PUBLICATIONS

Hasegawa, et al. entitled "Copper Dual Damascene Interconnects with Low–K . . . " dated 1999, pp. 623–626.
Morisawa, et al. entitled "Direct Patterning of Spin–On Glass Materials . . . " dated 1996, pp. 6366–6369.

* cited by examiner

Primary Examiner—Kuo-Liang Peng
(74) Attorney, Agent, or Firm—Bingham McCutchen LLP; Sandra P. Thompson

(57) ABSTRACT

A damascene structure includes a hard mask layer that is applied in a liquid phase to a line dielectric layer. Contemplated hard mask layers comprise a Si—N bond and are densified such that the etch resistivity of the hard mask layer is greater than the etch resistivity of the line dielectric layer and the via dielectric layer in the damascene structure. Particularly preferred hard mask layers include polyperhydrosilazane.

20 Claims, 3 Drawing Sheets

LAYERED HARD MASK AND DIELECTRIC MATERIALS AND METHODS THEREFOR

FIELD OF THE INVENTION

The field of the invention is manufacture of microelectronic devices, especially relating to damascene processing and methods of deposition of etch resistant material.

BACKGROUND OF THE INVENTION

Currently, aluminum and aluminum alloys are the most commonly used conductive materials in electronic interconnections in an integrated circuit. Aluminum alloys generally have many desirable properties, including relatively strong adhesion to silicon, and comparably low resistivity. However, as device miniaturization proceeds, the resistivity of aluminum becomes non-negligible and begins to contribute significantly to the resistance-capacitance (RC) time delay of a circuit. With even more progressive miniaturization, the use of aluminum will become increasingly problematic due to electromigration, stress-induced void formation, and current density limitations. Therefore, in view of the continuing decrease in size of elements in integrated circuits, a growing interest has developed to find alternative conductive materials in interconnect structures.

One especially promising alternative material is copper and copper alloys because of their greater robustness and higher electrical conductivity. For example, copper has an approximately 40% lower resistivity than aluminum, and has fewer reliability problems such as electromigration, etc. However, copper is more difficult to etch than aluminum alloys, and generally can not be processed in a conventional metallization process in which a metal layer is deposited on a substrate and etched to form conductive lines, and in which the space between the lines is subsequently filled with a line dielectric. To circumvent at least some of the problems associated with the use of copper in the fabrication of interconnect structures, a new process for the manufacture of interconnects has been developed, also known as damascene process.

In a typical damascene process, a line pattern is etched in the surface of a dielectric layer, and the trenches formed in this manner are filled with copper by electroplating, electroless plating, or sputtering. After the copper is deposited onto the entire surface, a chemical-mechanical planarization (CMP) step is employed to remove excess copper, and to planarize the wafer for subsequent processing steps. This process is typically repeated several times to form vias and lines in a multi-layer interconnect structure.

To further improve the damascene process, via and line formation can be integrated into a single process, which is then called dual damascene process. In the dual damascene process a via dielectric layer is laid down onto a substrate, and the via dielectric layer is subsequently coated with a patterned etch stop layer, whereby voids in the etch stop layer correspond to positions of vias that will be etched into the via dielectric. In a next step a line dielectric is deposited onto the etch stop layer, which in turn is coated with a patterned hard mask layer that defines the traces of the lines. In a following step via and line traces are formed, whereby the line trenches are etched into the line dielectric until the etchant reaches the etch stop layer. In positions where there is no etch stop layer, the etching process continues through the via dielectric to form a via. As in the damascene process, etched via and line traces are filled with copper (after applying a Ta(N) barrier layer and a Cu-seed layer) and a CMP step finishes the dual damascene process. A typical dual damascene process is described in U.S. Pat. No. 5,801,094 to Yew, T., et al, which is hereby incorporated by reference.

Although more efficient than the damascene process, the dual damascene process requires sequential deposition of additional layers of dielectric material with different etch selectivity. With respect to the deposition of the via and line dielectric, various relatively fast and efficient methods are known in the art to lay down the via and line dielectric material. However, due to the special chemical make up of the hard mask and the etch stop material, deposition is generally limited to chemical vapor deposition (CVD). CVD typically requires a separate production environment with reduced atmospheric pressure and relatively high temperatures, thereby at least partially limiting the choice of line and via dielectric to materials that are able to withstand such relatively harsh conditions. Furthermore, depending on the hard mask and the etch stop material, the CVD step is often time consuming, and usually adds additional cost to the production. A yet further disadvantage of known hard mask and etch stop materials is their relatively high dielectric constant (k-value). For example, typical hard mask and etch stop materials, including SiN, SiON, and $SiO_2$ have undesirably high dielectric constants in the range of about 7-4, respectively.

An additional problem arises when multiple damascene structure layers are required. Since copper exhibits a relatively fast diffusion rate, a diffusion barrier is generally needed to separate copper traces of one damascene layer from the via dielectric of the next damascene layer. Diffusion barriers typically comprise tungsten, tantalum, or various nitrides or carbides, including titanium nitride, tungsten nitride, titanium carbide, or tantalum nitride, and are generally applied by chemical vapor deposition. Alternatively, a $Ti_xAl_yN_z$ or aluminum wetting layer can be deposited by CVD or physical vapor deposition (PVD) techniques as diffusion barrier, which is described in U.S. Pat. No. 5,939,788, hereby incorporated by reference. Laying down a barrier layer by CVD or PVD does allow for a relatively controlled deposition, however, additional production time and frequently substantial cost is added to the production of multilayer dual damascene structures.

Although the use of layered dielectric materials with different etch selectivity enables the integration of copper in the fabrication of microelectronic devices, known methods to deposit layered dielectric materials are often relatively expensive, or employ materials with a comparably high dielectric constant. Therefore, there is a need to provide improved compositions and methods for producing layered dielectric materials having different etch selectivity from one another.

SUMMARY OF THE INVENTION

The present invention is directed to electronic devices and related methods, wherein the electronic devices include a hard mask layer that is applied in a liquid phase to a line dielectric layer (preferably in a spin-on process), wherein the hard mask layer comprises a Si—N bond, and wherein the hard mask layer is densified such that etch rate of the hard mask layer is less than the etch rate of both the line dielectric layer and the dielectric layer. It is further contemplated that the hard mask layer, the line dielectric layer, the via dielectric layer, and a copper element form a dual damascene structure.

In one aspect of the inventive subject matter, the line dielectric layer comprises an inorganic low dielectric constant material, or an organic low dielectric constant material, preferably a polyarylene ether, a polyarylene, a polyimide, or a cyanate ester resin. Especially preferred materials for the hard mask layer include polyperhydrosilazanes such as $(SiH_2-NH)_n$, with n=between 2 and 2000.

In another aspect of the inventive subject matter, the hard mask layer is densified using a process selected from the group consisting of a furnace cure process, a rapid thermal anneal process, a hot plate anneal process, and an electron beam process. Further preferred damascene structures include a diffusion barrier that is applied in a liquid phase to the hard mask layer, and that comprises a Si—N bond.

Various objects, features, aspects and advantages of the present invention will become more apparent from the following detailed description of preferred embodiments of the invention, along with the accompanying drawings in which like numerals represent like components.

DETAILED DESCRIPTION

As used herein, the term "low dielectric constant" refers to a dielectric constant (k-value) of less than 10. Especially contemplated are dielectric constants of less than 6, and more preferably of less than 3.

As also used herein, the term "etch resistivity to an etchant" characterizes the rate and/or dynamics with which an etchant dissolves, or physically or chemically disintegrates a substrate. A low etch resistivity corresponds to dissolution of a substrate at a relatively high rate, whereas a high etch resistivity corresponds to dissolution of a substrate at a relatively low rate. The term "etch resistivity to an etchant" does not necessarily describe an intrinsic characteristic of a substrate or etchant, but rather describes an interaction between a particular substrate and a particular etchant. For example, $SiO_2$ has a high etch resistivity to $H_2O$, whereas the same material has a low etch resistivity towards HF. Likewise, acetone is a strong etchant of polystyrene, but a weak etchant to $SiO_2$.

As further used herein, the term "etchant" refers to a reagent that is capable of dissolving, and/or chemical or physical degradation of a substrate. The etchant may be present in various forms, including a liquid, a mixture of liquids, a gas, ion plasma, or an electron beam.

Figure 1:
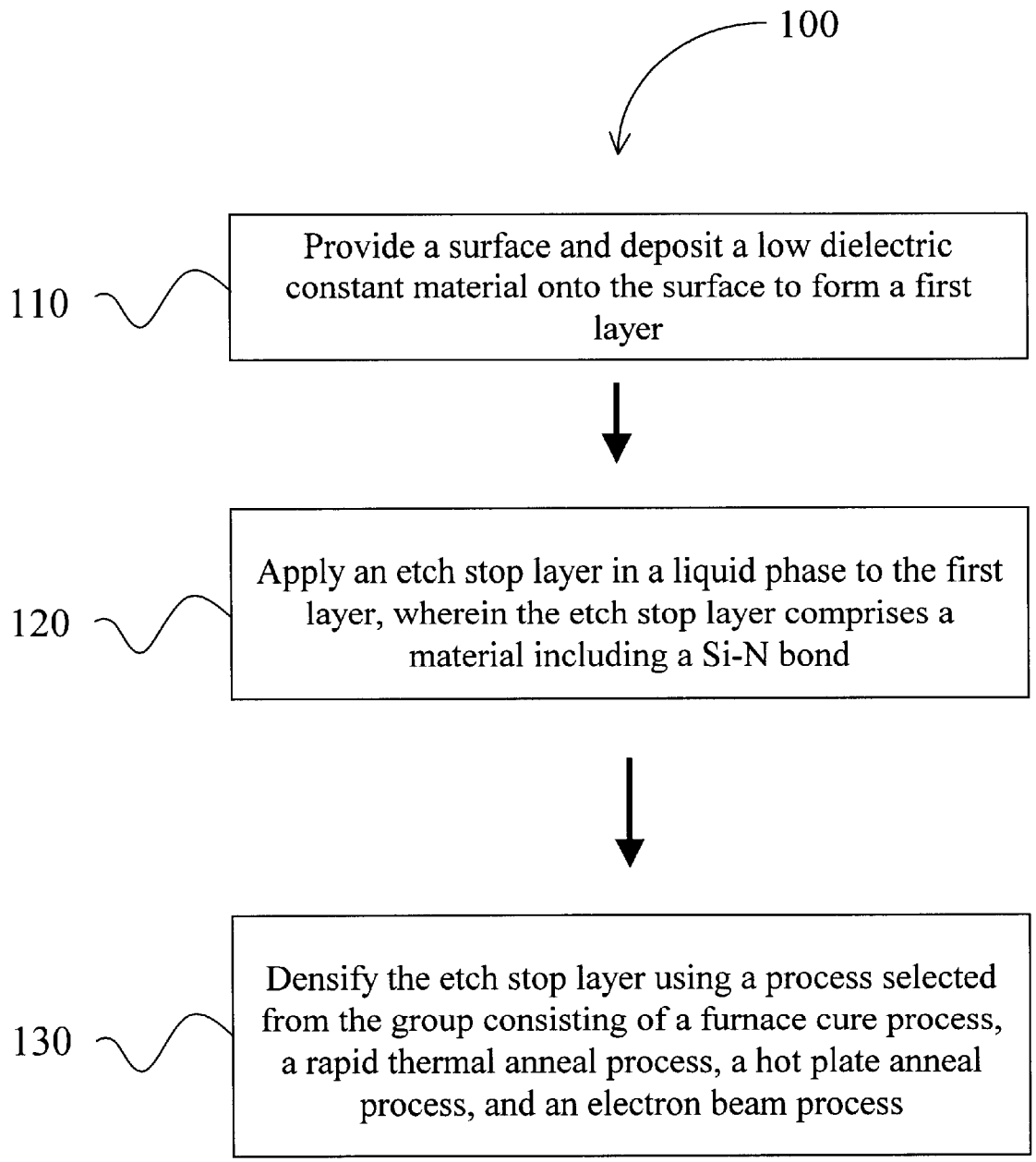
FIG. 1 is a flow diagram of one method according to the inventive subject matter.
Figure 2:
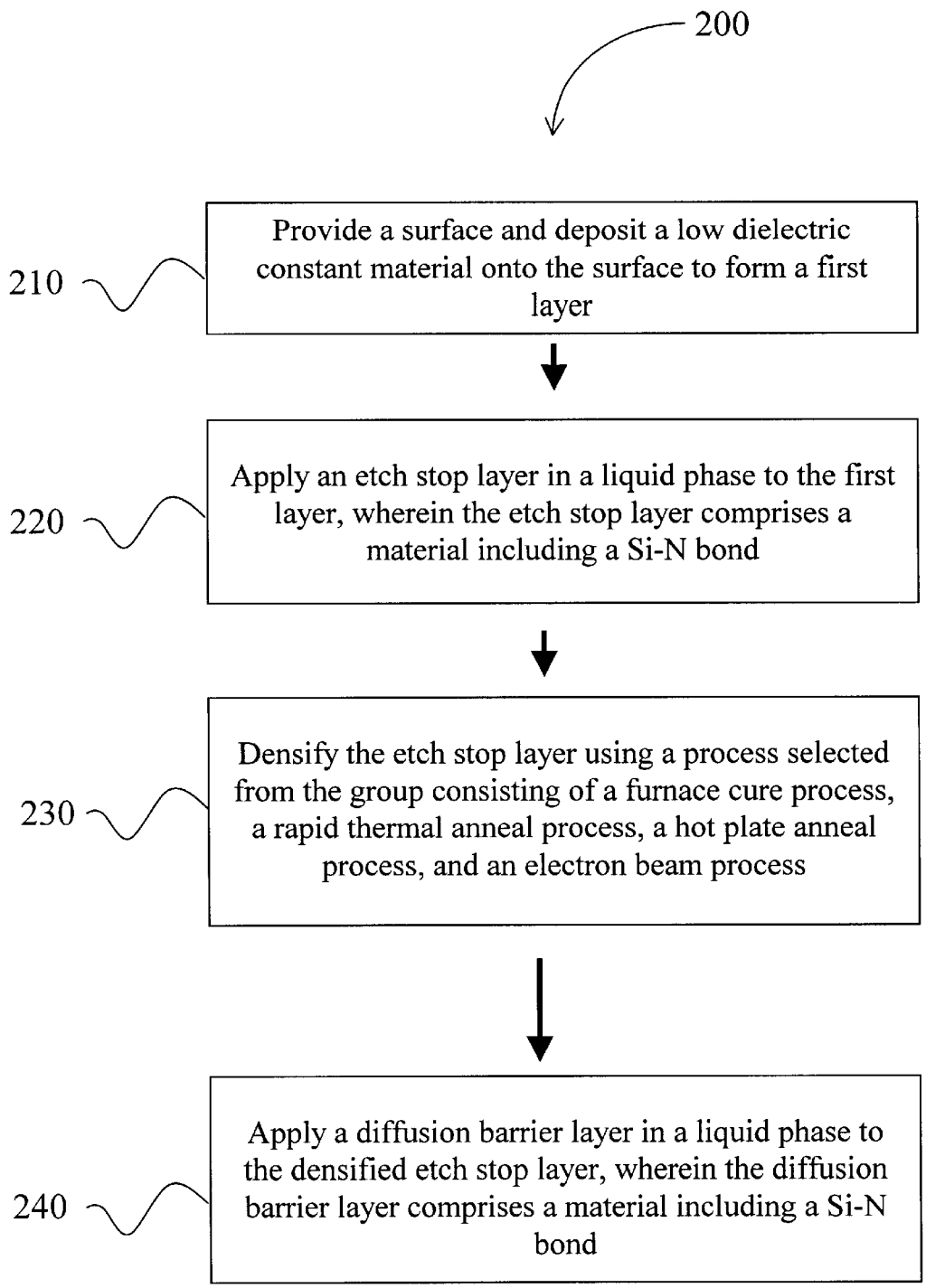
FIG. 2 is a flow diagram of another method according to the inventive subject matter.

Turning now to FIG. 1, a method 100 includes one step 110 in which a surface is provided, and in which a low dielectric constant material is deposited onto the surface to form a first layer. In another step 120, an etch stop layer is applied in a liquid phase to the first layer, wherein the etch stop layer comprises a material including a Si—N bond. In a still further step 130, the etch stop layer is densified using a process selected from the group consisting of a furnace cure process, a rapid thermal anneal process, a hot plate anneal process, and an electron beam process. The process may further include deposition of a diffusion barrier layer onto the etch stop layer, which is depicted in FIG. 2. This deposition of the diffusion barrier onto the etch stop layer is outlined in step 240, in which the diffusion barrier layer is deposited in a liquid phase to the densified etch stop layer, wherein the diffusion barrier layer comprises a material including a Si—N bond.

Figure 3:
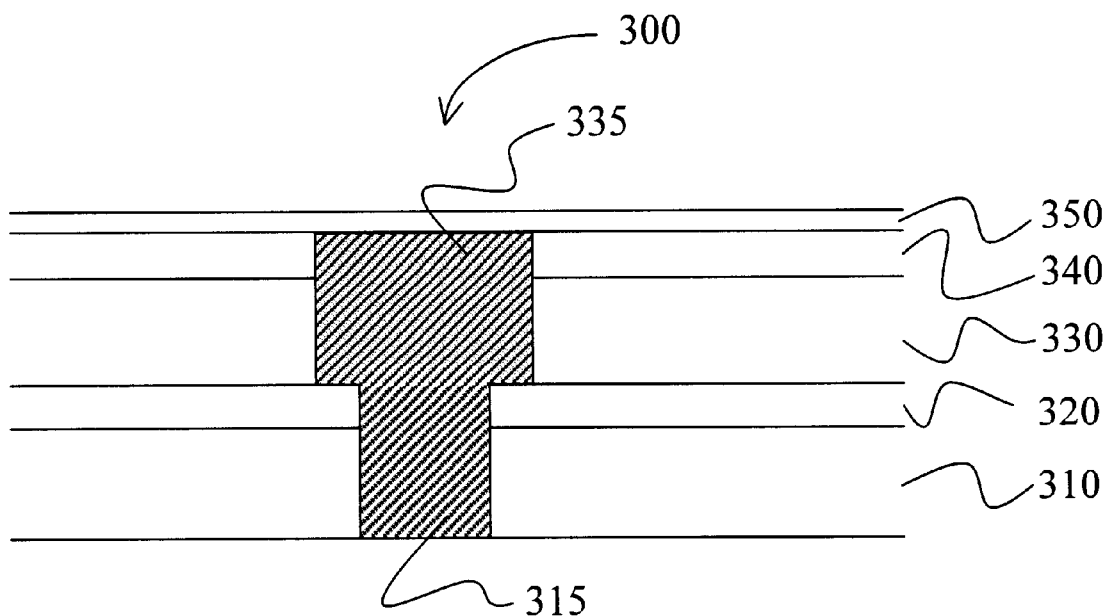
FIG. 3 is a side view of a vertical cross section of a dual damascene structure according to the inventive subject matter.

Consequently, particularly contemplated electronic devices may include a dual damascene structure as shown in FIG. 3. Here, a vertical cross section of an exemplary dual damascene structure 300 includes a copper filled via 315, which is embedded in the via dielectric 310 and etch stop layer 320. Copper line 335 is embedded in line dielectric 330 and hard mask 340, and the diffusion barrier 350 is the top layer covering both the hard mask 340 and the copper line 335.

In an especially contemplated aspect of the inventive subject matter, the via dielectric layer and the etch stop layer of a dual damascene structure are formed using conventional methods and compositions known in the art. For example suitable material and processes for the formation of the via dielectric layer and the etch stop layer are described in U.S. Pat. No. 5,801,094 to Yew, T., et al, or in U.S. Pat. No. 5,466,639 to Ireland, incorporated herein by reference. In a further step, (typically following processing of the etch stop layer) the line dielectric layer is deposited onto the etch stop layer. A preferred material for the line dielectric layer is silicon oxide, which is deposited onto the surface of the etch stop layer as a low dielectric material to a thickness of several thousand angstroms by low pressure CVD (LPCVD) using tetraethylortho-silicate (TEOS) as a source gas. In a still further step, polyperhydrosilazane is deposited onto the silicon oxide layer as a second low dielectric material from a 5% (by weight) solution in oxylene by spin coating at 1000–4000 rpm, and cured for approximately 120 minutes at 350° C. to form a hard mask layer.

With respect to the line dielectric layer, it is contemplated that various organic, silicon-containing, and inorganic low dielectric constant materials are suitable for the formation of the line dielectric, and preferred materials for the line dielectric include material comprising silicon oxide. However, various alternative low dielectric constant materials are also contemplated so long as the low dielectric constant material for the line dielectric has a lower etch resistivity toward an etchant than the hard mask layer. Inorganic low dielectric constant materials may be especially advantageous where higher temperature resistance of the dielectric material is desirable, where CVD deposition of the first low dielectric material is desired, or where applications demand an etchant that is derived from mixtures comprising fluorocarbons such as $C_4F_8/CO$, or $CF_4/CHF_3$. For example, contemplated inorganic materials include modified silicon dioxide and aluminum oxide. Organic materials may be especially desirable in applications where CVD deposition of the first low dielectric constant material is to be avoided, and particularly suitable organic materials include polyarylene ethers, polyarylenes, polyimides, and cyanate ester resins. Thus, organic materials are especially contemplated that can be applied onto a surface by various alternative methods, including spin-coating, dip coating, doctor-blading, etc. Other applications may favor organic materials that allow control over the degree of curing or crosslinking of the first low dielectric constant material. Therefore, low dielectric constant materials are especially contemplated that can be polymerized from monomers or block monomers, and/or crosslinked. For example, contemplated materials include derivatized and underivatized polyarylenes, polyesters, polyimides, polybenzazoles, polyphenylenes, etc. Siliconcontaining low dielectric materials are disclosed in commonly assigned U.S. Pat. No. 6,143,855 and include HOSP™ (spin-on hybrid siloxane-organic polymer, commercially available from Honeywell).

It should also be recognized, that although the line dielectric layer preferably has a thickness of several thousand angstroms, the thickness of the line dielectric layer may vary considerably between approximately 50 angstrom or less, and several hundred micrometers. For example, in applications that demand a thin dielectric interlayer without a dedicated structure (e.g., a via, line, or other functional or structural element), a thickness of approximately 100 angstrom may be sufficient. However, in other applications where the surface onto which the first layer is deposited is substantially uneven, and where a planarization step is required, the minimum thickness may well exceed 8000 angstroms.

With respect to methods of depositing the low dielectric constant material for the line dielectric layer, it should be appreciated that the material chosen for the line dielectric layer generally dictates the particular method that is employed. Consequently, the line dielectric layer need not necessarily be laid down by LPCVD with TEOS as a source gas. Alternatively, various methods known in the art are also contemplated, including CVD, PVD, spin coating, dip coating, doctor-blading, and so forth. Spin coating may be especially advantageous when both the line dielectric and the hard mask layer are deposited by spin coating.

In a further aspects of the inventive subject matter, the material for the hard mask need not be restricted to a polyperhydrosilazane and alternative materials include various low dielectric constant materials including organic and inorganic materials, so long as (a) the alternative material can be applied in a liquid phase and (b) the etch resistivity of the alternative material to an etchant is higher than the etch resistivity of the line dielectric material to the etchant. Especially contemplated alternative materials include simple and complex polysilazanes. As used herein, a polysilazane comprises repeating units having at least one silicon-nitrogen bond. Simple polysilazanes may include substituted and unsubstituted repeating monomers having a single silicon-nitrogen bond, whereas complex polysilazanes may have substituted and unsubstituted repeating monomers wherein the Si—N-group has additional heteroatoms, including C, O, B, etc. (infra). Further contemplated materials include organic and silicon-containing low dielectric materials in monomeric, oligomeric, and polymeric form. Appropriate organic materials may advantageously exhibit high solubility in various solvents, miscibility with other organic materials, low viscosity, high gap-filling potential, and dielectric constants of approximately below 6, and less. Organic materials may further allow fine-tuning of desired physicochemical properties such as moisture absorption, flexibility, degree of crosslinking, etc. Contemplated organic materials include polyphenyls, polyimides, polyamides, epoxypolymers, polyethers, polyesters, etc., or their respective precursors. When enhanced etch resistivity towards etching conditions (e.g., oxygen plasma etching) is particularly desirable, inorganic materials are especially contemplated. For example various polysilazanes, including polyperhydrosilazane, exhibit good etch resistivity to oxygen plasma etching.

It should also be appreciated that additives may be added to the hard mask low dielectric material. For example, in some applications additives may be employed to increase the etch resistivity towards a particular etching condition (e.g., by chemically quenching the etchant, or by additional crosslinking of hard mask material). In other applications additives may be added to enhance adhesion to line dielectric layer. In still further applications, additives may be added to lower the dielectric constant of the material. The concentration of the additives may vary from instance to instance, but it is generally contemplated that additives typically do not exceed 35% (by weight).

In a yet further aspect of alternative embodiments, the method of deposition of the hard mask material may vary among several applications and need not be limited to spin coating, as long as the low dielectric constant hard mask material is a liquid coated layer (i.e. is applied in a liquid phase). Contemplated methods may include roll coating, dip coating, spray coating, and so forth. In cases where the thickness of the hard mask layer is not critical, other methods of application are also contemplated, including brushing or rinsing. There are many appropriate solvents for applying the hard mask material, and the actual solvent will vary with the dielectric material that is desired. For example, contemplated solvents include polar and apolar solvents, as well as protic and aprotic solvents. Regardless of the method of deposition it should be appreciated that an intermediate is formed comprising a first dielectric material, the second dielectric material and a liquid. For example, in a dual damascene structure the intermediate could comprise a line dielectric layer and a hard mask layer in a liquid phase. In a further example, the intermediate could comprise a line dielectric layer, a hard mask layer, and a diffusion barrier layer in a liquid phase.

With respect to densification of the hard mask layer it is contemplated that various curing conditions other than baking for 60 minutes at 350° C. are also appropriate. For example, depending on the type of material utilized, shorter curing times between 60 minutes and 10 minutes, or less are contemplated. Short curing times may advantageously lead to reduced thermal stress, a decrease in production times, or an increase in material flow. However, when low dielectric materials with a relatively slow curing rate are implemented, curing may be performed for longer times between 60–120 minutes and several hours. Curing times may also be extended to completely drive off residual solvent, especially when non-aqueous solvent is utilized. Alternatively, the hard mask layer may be densified using a furnace cure process, a rapid thermal anneal process, a hot plate anneal process, and an electron beam process, all of which are known processes to a person of ordinary skill in the art. With respect to duration and conditions of alternative densification processes, it is contemplated that a particular densification process will typically depend on the particular material employed and will readily be determined without undue experimentation by a person of ordinary skill in the art.

In yet further alternative aspects of the inventive subject matter, an additional diffusion barrier layer is deposited onto the surface of the hard mask (and the copper conductor) to prevent or reduce copper diffusion. In an exemplary process, silicon oxide is deposited as low dielectric material onto the surface of an etch stop layer in the construction of a dual damascene structure to a thickness of several thousand angstroms by low pressure CVD (LPCVD) using tetraethyl-orthosilicate (TEOS) as a source gas to form a line dielectric layer. Polyperhydrosilazane is then deposited onto the silicon oxide layer from a 5% (by weight) solution in o-xylene by spin coating at 1000–4000 rpm, and cured for approximately 120 minutes at 350° C. to form a hard mask layer. After patterning of the hard mask layer, etching, copper filling and CMP, the diffusion barrier layer is deposited onto the damascene structure from a 5% (by weight) polyperhydrosilazane solution in o-xylene by spin coating at 1000–4000 rpm, and cured for approximately 60 minutes at 350° C.

With respect to various aspects of the line dielectric layer and various aspects of the hard mask layer, the same considerations as discussed above apply. With respect to the material for the diffusion barrier, it is contemplated that numerous materials other than a polysilazane may also be utilized in the formation of the diffusion barrier layer, so long as the diffusion barrier layer has a higher etch resistivity to the etchant as the line dielectric layer. For example, the diffusion barrier layer material may be an organic or an inorganic polymer, or precursor of a polymer (supra). It should also be appreciated that the diffusion barrier material need not necessarily be deposited after several processing steps (i.e. patterning, etching, copper filling and CMP). For example, some applications may require an additional third layer of low dielectric material with a relatively high etch resistivity for back etching.

It is contemplated that in some embodiments a dual damascene structure may comprise a line dielectric layer, an etch stop layer disposed on top of the line dielectric layer, a via dielectric layer disposed on top of the etch stop layer, and a hard mask layer, disposed on top of the via dielectric layer, wherein at least one of the etch stop layer and the hard mask layer is a liquid coated layer, and wherein at least one of the etch stop layer and the hard mask layer comprises silicon. In other embodiments both the etch stop layer and the hard mask layer may be a liquid coated layer, and the etch stop layer and the hard mask layer may comprise silicon. In still further embodiments, the dual damascene structure may comprise an additional diffusion barrier layer, wherein the diffusion barrier layer is a liquid coated layer, and wherein the diffusion barrier layer comprises silicon. With respect to the chemical composition of the etch stop layer, the hard mask layer and the diffusion barrier it is contemplated that said layers may advantageously comprise polysilazane and/or polyperhydrosilazane. It should also be appreciated that at least one of the etch stop layer, hard mask layer, and diffusion barrier may be a liquid coated layer.

Figure 4:
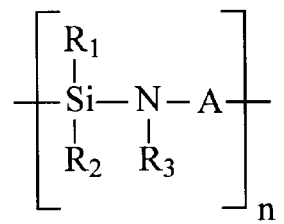
FIG. 4 is an exemplary formula of a Si—N bond-containing hard mask material according to the inventive subject matter.

FIG. 4 shows a general structure of a polysilazane with n typically between 2 and 20,000. When $R_1=R_2=R_3=H$, and A is a bond, then the polysilazane is referred to as a polyperhydrosilazane. When A is a bond, and $R_1=R_2=H$, and $R_3$ is an organic substituent then the polysilazane is referred to as a simple polysilazane. The organic substituent may include various atoms, preferably C, N, or S, and may have a molecular weight of up to about 120 Da. Contemplated substituents include a phenyl, an ethynyl, a trifluoromethyl group, and an amino group. Preferred substituents are chemical groups that confer increased resistance to etchants, especially including oxygen plasma. It should also be appreciated that $R_1$ and $R_2$ need not be identical, and may be different from H. For example, appropriate substituents may include substituents comprising C, N, O, and S, but also Si and Al. It is especially contemplated that $R_1$ and/or $R_2$ may be branching points of a polysilazane, i.e., another polysilazane may originate from $R_1$ and/or $R_2$. When A is not a bond, the polysilazane is referred to as a complex polysilazane. It is contemplated that A may be a single atom, including O or S, but also a substituent comprising heteroatoms, including C, O, N, Halogens, etc. With respect to the molecular weight it is contemplated that appropriate substituents are less than 150 Da. It is also contemplated that in complex polysilazanes no more than 6 atoms separate one silicon atom in one monomer from another silicon atom in another monomer. Especially preferred substituents may advantageously influence physico-chemical properties such as adhesion, low dielectric constant, or flame retardancy. Still further contemplated variations of simple and complex polysilazanes are described in U.S. Pat. No. 5,459,114 to Kaya et al., and U.S. Pat. No. 5,905,130 to Nakahara et al, hereby incorporated by reference.

Thus, specific embodiments and applications of layered dielectric structures have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises", and "comprising", should be interpreted as referring to elements, components, or steps in a non-exclusive manner, indicating that the referenced elements, components, or steps may be present, or utilized, or combined with other elements, components, or steps that are not expressly referenced.

What is claimed is:

1. An electronic device comprising:
   a hard mask layer that is applied in a liquid phase to a line dielectric layer, wherein the hard mask layer comprises a Si—N bond, and wherein the hard mask layer is densified such that the hard mask has an etch resistivity that is greater than both an etch resistivity of the line dielectric layer and an etch resistivity of a via dielectric layer; and
   wherein the hard mask layer, the line dielectric layer, the via dielectric layer, and a copper element are configured to form a dual damascene structure.

2. The electronic device of claim 1 wherein the line dielectric layer comprises an organic low dielectric constant material.

3. The electronic device of claim 2 wherein the organic low dielectric constant material is selected from the group consisting of a polyarylene ether, a polyarylene, a polyimide, and cyanate ester resin.

4. The electronic device of claim 1 wherein application of the hard mask in liquid phase comprises a spin-on process.

5. The electronic device of claim 1 wherein the hard mask layer is formed from a polyperhydrosilazane.

6. The electronic device of claim 5 wherein the polyperhydrosilazane has a structure represented by $(SiH_2—NH)_n$, wherein n is an integer between 2 and 2000.

7. The electronic device of claim 1 wherein the hard mask layer is densified using a process selected from the group consisting of a furnace cure process, a rapid thermal anneal process, a hot plate anneal process, and an electron beam process.

8. The electronic device of claim 1 further comprising a diffusion barrier, wherein the diffusion baffler is applied in a liquid phase to the hard mask layer.

9. The electronic device of claim 8 wherein the diffusion barrier comprises a Si—N bond.

10. The electronic device of claim 9 wherein the diffusion barrier layer is formed from a polyperhydrosilazane.

11. The electronic device of claim 10 wherein the polyperhydrosilazane has a structure represented by $(SiH_2—NH)_n$, wherein n is an integer between 2 and 2000.

12. A method of forming a dual damascene structure, comprising:
    providing a surface and depositing a low dielectric constant material onto the surface to form a first layer;

applying an etch stop layer in a liquid phase to the first layer, wherein the etch stop layer comprises a material including a Si—N bond; and densifying the etch stop layer using a process selected from the group consisting of a furnace cure process, a rapid thermal anneal process, a hot plate anneal process, and an electron beam process.

13. The method of claim 12 further comprising applying a diffusion barrier layer in a liquid phase to the densified etch stop layer, wherein the diffusion barrier layer comprises a material including a Si—N bond.

14. The method of claim 13 wherein the dual damascene structure further includes copper as a conductive material.

15. The method of claim 12 wherein the low dielectric constant material comprises an organic low dielectric constant material.

16. The method of claim 15 wherein the organic low dielectric constant material is selected from the group consisting of a polyarylene ether, a polyarylene, a polyimide, and cyanate ester resin.

17. The method of claim 13 wherein the diffusion barrier layer material is a polysilazane or a polyperhydrosilazane.

18. The method of claim 17 wherein the polyperhydrosilazane has a structure represented by $(SiH_2-NH)_n$, wherein n is an integer between 2 and 2000.

19. The method of claim 13 wherein the step of densifying the etch stop layer uses an electron beam process.

20. The method of claim 13 wherein the etch stop layer and the diffusion barrier layer are formed from polyperhydrosilazane.

* * * * *